United States Patent [19]

Takeda

[11] Patent Number: 4,624,910
[45] Date of Patent: Nov. 25, 1986

[54] IMAGE RECORDING PROCESS
[75] Inventor: Keiji Takeda, Kanagawa, Japan
[73] Assignee: Fuji Photo Film Co., Ltd., Kanagawa, Japan
[21] Appl. No.: 738,002
[22] Filed: May 28, 1985
[30] Foreign Application Priority Data
  May 25, 1984 [JP] Japan ................. 59-106225
[51] Int. Cl.⁴ .................. G03C 5/54; G03C 5/16
[52] U.S. Cl. ................. 430/203; 430/202; 430/213; 430/330; 430/328; 430/235; 430/222
[58] Field of Search ............. 430/203, 202, 213, 330, 430/328, 235, 222

[56] References Cited
U.S. PATENT DOCUMENTS

| | | | |
|---|---|---|---|
| 3,335,006 | 8/1967 | König et al. | 430/203 |
| 4,287,290 | 9/1981 | Mizuno et al. | 430/202 X |
| 4,547,450 | 10/1985 | Maeda et al. | 430/202 |
| 4,560,637 | 12/1985 | Maeda et al. | 430/202 |

FOREIGN PATENT DOCUMENTS

| | | | |
|---|---|---|---|
| 2000110 | 8/1969 | France | 430/202 |
| 58-78153 | 6/1983 | Japan. | |
| 58-174947 | 10/1983 | Japan. | |
| 58-169143 | 10/1983 | Japan. | |
| 954206 | 4/1964 | United Kingdom | 430/213 |

*Primary Examiner*—John E. Kittle
*Assistant Examiner*—Cynthia Hamilton
*Attorney, Agent, or Firm*—Sughrue, Mion, Zinn, Macpeak & Seas

[57] ABSTRACT

The present invention relates to an image recording process which comprises a step of (i) imagewise exposing a layer containing at least silver halide of an image recording material comprising (a) silver halide, (b) a reducing agent capable of developing silver halide, (c) a photopolymerization sensitizing dye capable of being reduced into a leuco substance by said reducing agent, and (d) a polymerizable vinyl monomer, to light to form a latent image, a step of (ii) uniformly heating said recording material to form a photopolymerization sensitizing dye image in a part corresponding to said latent image, and thereafter a step of (iii) uniformly exposing a layer containing at least said formed photopolymerization sensitizing dye image and said polymerizable vinyl monomer to light to form a polymer image in the part where said photopolymerization sensitizing dye image is present, by photopolymerization. By this process, polymer images formed by photopolymerization can be obtained even if the exposure amount is low, and the polymer image can be obtained by dry processing at a low exposure amount.

9 Claims, 4 Drawing Figures

1 — SILVER HALID LIGHT-SENSITIVE MATERIAL

7 — PHOTOPOLYMERIZABLE MATERIAL

14 — HEAT-SENSITIVE MATERIAL

IMAGE EXPOSURE

UNIFORM EXPOSURE

IMAGE RECORDING PROCESS

FIELD OF THE INVENTION

The present invention relates to an image recording process utilizing a polymerization reaction and, particularly, to a process of recording a polymer image using silver halide. Particularly, it relates to a process capable of recording by dry processing as well.

BACKGROUND OF THE INVENTION

Photopolymerization reactions using organic dyes as photosensitizers and image recording processes utilizing them have been known. However, the sensitivity thereof is relatively lower than that of silver halide light-sensitive materials, for example the ISO sensitivity thereof is generally $10^{-3}$ or less. Although the polymer image obtained by photopolymerization has various uses, use of it is restricted because of the low sensitivity. Thus, high sensitivity of a photopolymerization process has been desired.

Various processes have been attempted for sensitizing polymerization reactions using a silver halide emulsion as a light-sensitive material. For example, there is a process wherein a polymerization reaction is caused by radicals formed in the step of development of silver halide as described in Japanese Patent Applications (OPI) Nos. 78153/83, 169143/83 and 174947/83 (the term "OPI" as used herein refers to a "published unexamined Japanese patent application"), a process wherein polymerization reaction is caused by radicals formed in the case of oxidizing silver images obtained from silver halide with peroxide as described in U.S. Pat. No. 3,241,962, a process wherein silver halide in the nonexposed area is transferred and a polymerization reaction is caused by radicals formed by oxidizing the transferred silver halide with peroxide as described in U.S. Pat. No. 3,345,164, a process wherein silver halide is developed with a ferrous salt and a polymerization reaction is caused by radicals formed by oxidizing the residual ferrous salt with peroxide as described in U.S. Pat. No. 3,029,145, and the like. However, all of these processes require wet processing in the steps of development of the silver halide light-sensitive material and radical formation.

Accordingly, it has been desired, hitherto, that polymer images formed by photopolymerization can be obtained even if the exposure amount is low. Further, it has been desired that the polymer image can be obtained by dry processing at a low exposure amount.

SUMMARY OF THE INVENTION

As a result of earnest studies, the present inventors have solved the above problems by providing the following image recording processes (1) and (2) and the present invention has been attained.

(1) An image recording process comprises (i) imagewise exposing a layer containing at least silver halide of an image recording material comprising (a) silver halide, (b) a reducing agent capable of developing silver halide, (c) a photopolymerization sensitizing dye capable of being reduced into a leuco substance by the reducing agent, and (d) a polymerizable vinyl monomer, to light to form a latent image, (ii) uniformly heating the recording material to form a photopolymerization sensitizing dye image in a part corresponding to the latent image, and thereafter (iii) uniformly exposing a layer containing at least the formed photopolymerization sensitizing dye image and the polymerizable vinyl monomer to light to form a polymer image in the part where the photopolymerization sensitizing dye image is present, by photopolymerization.

(2) The image recording process (1) above further comprises (iv-1) bleaching a dye capable of being bleached by vinyl monomers with the polymerizable vinyl monomer which was not polymerized, or (iv-2) thermally developing a dye precursor under heating to form a dye capable of being bleached by vinyl monomers and bleaching the dye with the polymerizable vinyl monomer which was not polymerized, to form a dye image, after the uniform exposure to light the layer containing the photopolymerization sensitizing dye image and the polymerizable vinyl monomer.

DETAILED DESCRIPTION OF THE INVENTION

Figure 1A:
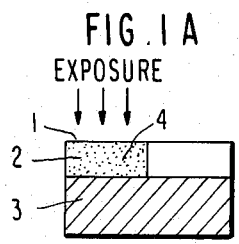
FIG. 1 indicates an embodiment of the process of the present invention. (A) shows an imagewise exposed silver halide light-sensitive material 1. 2 is a light-sensitive layer containing silver halide and a reducing agent, 3 is a base, and 4 is a latent image. (B) shows the state wherein silver halide is developed. 5 is a part containing a silver image and an oxidized reducing agent, and 6 is a part containing unreacted silver halide and a reducing agent. (C) shows a state wherein a developed silver halide light-sensitive material and a photopolymerizable material 7 are brought in contract and heated to transfer the reducing agent. 8 is a photopolymerizable layer, 9 is a base, 10 is a part containing a photopolymerization sensitizing dye, and 11 is a part wherein the photopolymerization sensitizing dye is reduced to form a leuco substance. (D) shows a state wherein the photopolymerizable layer is uniformly exposed to light. 12 is a polymer image part, and 13 is a part containing an unreacting monomer. (E) shows a state wherein it is brought in contact with a heat-sensitive material 14 and heated. 15 is a heat-sensitive color forming layer, 16 is a base, 17 is a dye image part formed by development of the heat-sensitive material, and 18 is a colorless nonimage part wherein the dye is bleached by the monomer.
Figure 1B:
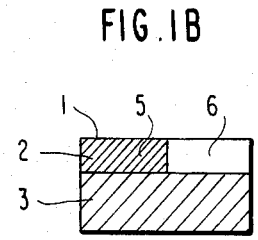
Figure 1C:
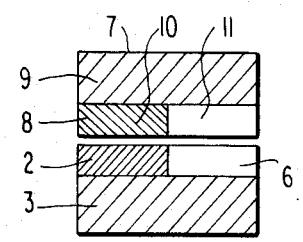
Figure 1D:
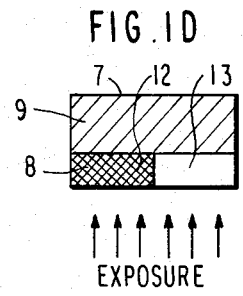

Image recording process according to the present invention basically comprises the following steps A to B or A to C;

A. Formation of a photopolymerization sensitizing dye pattern.
B. Formation of a polymer image by photoamplification using the above described photopolymerization sensitizing dye pattern.
C. Formation of a dye image using the above described polymer image pattern.

In the step A, a photopolymerization sensitizing dye is uniformly distributed in the photopolymerizable layer and reductively bleached with a reducing agent to convert it into a leuco substance of the photopolymerization sensitizing dye. Therefore, the reducing agent should be present as a pattern corresponding to the image exposure. Formation of the pattern of the reducing agent is carried out using a reducing agent uniformly distributed in the silver halide light-sensitive layer as a developing agent for silver halide. That is, the reducing agent is oxidized and consumed in the developing step corresponding to the latent image (pattern), namely, image exposure and, thereby, unreacted reducing agent is remained as a counter-pattern corresponding to the image exposure. In the step B, the whole face having the photopolymerization sensitizing dye pattern is uniformly exposed in the presence of a polymerizable vinyl monomer and a hydrogen donative compound to cause a photopolymerization reaction according to the quantity of the photopolymerization sensitizing dye (pattern), by which the polymer image is formed. The polymerization can be carried out by injection of a sufficient amount of outside light energy, whereby it is possible to form a sufficient amount of polymer from a very small amount of the photopolymerization sensitizing dye, namely, to carry out photoamplification. In the step C, bleaching of a dye is carried out by unpolymerized residual monomer to form a dye image.

The above described process of forming a polymer image can be represented by the following chemical reaction formulas.

(1) Image exposure

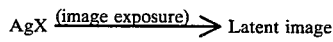

(2) Formation of reducing agent pattern by development of silver halide

AgX      Ag atom

Reducing agent      Oxidized reducing agent (3) Formation of photopolymerization sensitizing dye pattern Residual reducing agent
(pattern)+Photopolymerization sensitizing dye→Leuco dye (colorless)

(4) Formation of polymer image by photoamplification

Photopolymerization sensitizing dye (pattern) +
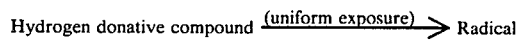

In this process, the amount of the photopolymerization sensitizing dye required for photoamplification may be very small (for example, the optical density of the photopolymerization sensitizing dye is 0.05 to 0.3 or so). The bleaching of the photopolymerization sensitizing dye with the reducing agent is caused and amplified at the same efficiency as in the development process of the silver halide, and the photopolymerization of the monomer is also carried out by a photoamplification process. Thus, the formation of polymer image by photoamplification process contains two-stage amplifications as the whole. Therefore, it is possible to record a polymer image using only a small amount of silver at a photosensitivity comparable with the conventional silver halide light-sensitive material. Further, when a reducing agent is previously contained in the silver halide light-sensitive layer, it is possible to form a polymer image by complete dry processing. This is because development of silver halide can be carried out by heating, and bleaching of the photopolymerization sensitizing dye can be carried out by thermal diffusion of the reducing agent.

In the following, one embodiment of the present invention is illustrated with reference to the drawings. In FIG. 1(A), a silver halide light-sensitive material 1 containing a reducing agent (developing agent) is imagewise exposed to light to form a latent image 4. When it is developed with heat, a silver image is formed on the exposed part and the reducing agent is oxidized at the same time, part 5 as shown in (B), in the case of the conventional negative silver halide emulsion. In (C), when the developed silver halide emulsion layer of the silver halide light-sensitive material is brought in contact with a photopolymerizable layer and heated, the reducing agent remaining in the unexposed part 6 is transferred to the photopolymerizable layer 8 by diffusion, by which the photopolymerization sensitizing dye is bleached in proportion to the amount of the reducing agent (part 11), and the unbleached photopolymerization sensitizing dye pattern remains in the part 10 corresponding to the silver image (exposed part). In (D), when the photopolymerizable layer 8 is uniformly exposed to light, a polymer image (negative-positive type) corresponding to the unbleached photopolymerization sensitizing dye pattern is formed. Uniform exposure may be carried out from the back of the photopolymerizable layer through a base 9 in the state of (C).

In the above process, an example wherein thermal transfer of the reducing agent is carried out by bringing the silver halide light-sensitive material in contact with the polymerizable layer after thermal development of the silver halide light-sensitive material has been illustrated. However, a similar result is obtained, after formation of the latent image, by bringing the silver halide light-sensitive material in contact with the photopolymerizable layer and heating, at which point development of the silver salt, transfer of the reducing agent, and bleaching of the photopolymerization sensitizing dye can be carried out by one step of heating.

When a positive type silver halide emulsion, wherein a silver image is formed on the unexposed part, is used, it is possible to form a positive-positive type polymer image. In another embodiment, the silver halide emulsion layer and the photopolymerizable layer can be laminated to form a monosheet recording material.

Figure 1E:
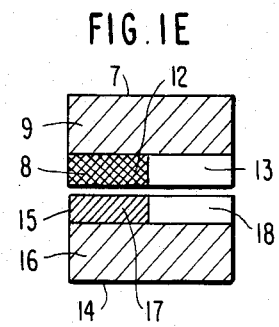

The polymer image formed as described above can be subjected to desired development processing according to the purpose of the final use. Namely, when the polymer image is used as a relief image, a printing plate or a resist development can be carried out by dissolving the unpolymerized part of the photopolymerizable layer with a solvent by the known process. In this case, if the photopolymerizable layer previously contains a coloring agent, a visible image is obtained. Utilizing the adhesive property of the unpolymerized part, the unpolymerized part may be colored by allowing a pigment powder to adhere to form a visible image. In another process, a dye image can be formed using the polymer image obtained as described above. This process which has been described in U.S. patent application Ser. No. 677,453 filed on Dec. 3, 1984 is that wherein the polymer image is visualized by bleaching the dye with unpolymerized residual monomer (hereinafter, this process is called "monomer-dye bleaching process"). As shown in FIG. 1(E), when the photopolymerizable material 7 having a polymer image 12 obtained in (D) is brought in contact with the heat-sensitive material 14 and heated, the heat-sensitive material is developed to form a dye, but the dye on the part corresponding to the part 13 (where the monomer remains) is bleached by the thermally diffused monomer and, consequently, a dye image corresponding to the polymer image is formed. If this process is used for development (visualization) of the polymer image, the whole process of the present invention can be carried out by only dry processing.

Further, in a specific case of the above described process, image formation can be carried out as follows. In the above described process, silver halide having a latent image is developed by the reducing agent and the photopolymerization sensitizing dye is reduced into its leuco substance by the reducing agent remaining in the unexposed part, whereby a pattern of the photopolymerization sensitizing dye is formed. To the contrary, the photopolymerization sensitizing dye is previously allowed to react with the reducing agent to convert it into a leuco substance uniformly prior to image exposure or development of silver halide, and silver halide having a latent image is then developed with the leuco substance as a developing agent. As a result of the development, the leuco substance is oxidized to directly form a photopolymerization sensitizing dye as a pattern. In this case, likewise the above described process, photopolymerization is caused in the part where the photopolymerization sensitizing dye is present by uniform exposure, and a polymer image is formed in the part where the latent image is present.

Specific embodiments of this process are described below.

Figure 2A:
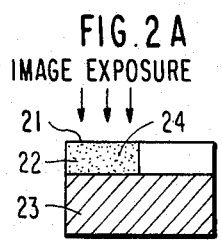
FIG. 2 indicates a second embodiment of the light-sensitive material and the image recording process of the present invention. (A) represents an imagewise exposed light-sensitive material, (B) represents a state of thermally developing it, (C) represents a state of uniformly exposing it to light to form a polymer image, and (D) represents a state that a dye image is formed by a monomer-dye bleach process. 21 represents a light-sensitive material having a single light-sensitive layer, and 34 represents a heat-sensitive material.
Figure 2B:
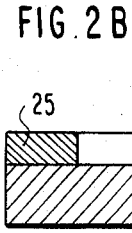
Figure 2C:
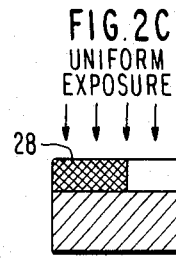
Figure 2D:
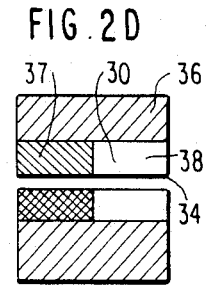
Figure 3:
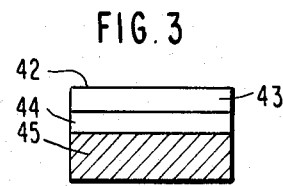
FIG. 3 indicates another embodiment of the light-sensitive material of the present invention, wherein a light-sensitive material 42 comprises a base 45 and having coated thereon a light-sensitive layer composed of adjacent two layers, i.e., a light-sensitive layer 44 and a light-sensitive layer 43.
Figure 4:
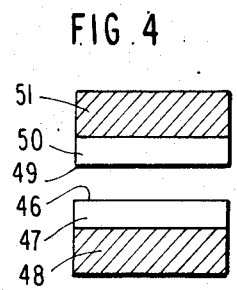
FIG. 4 indicates a further embodiment of the light-sensitive material of the present invention. It is composed of a combination of a sheet 46 containing silver halide and a sheet 49 containing a leuco substance of a photopolymerization sensitizing dye and a polymerizable vinyl monomer.

The light-sensitive material includes the case where light-sensitive layers are provided on the same support as shown in FIG. 2(A) and FIG. 3 and the case where light-sensitive layers are provided on different supports as shown in FIG. 4. It is more desirable to provide the light-sensitive layers on the same support, because it can be conveniently used. In FIG. 2(A), the light-sensitive material 21 comprises a single light-sensitive layer 22 composed of silver halide, a leuco substance of a photopolymerization sensitizing dye, a polymerizable vinyl monomer (hereinafter referred to as "monomer") and a binder provided on a support 23. The light-sensitive material 42 shown in FIG. 3 comprises a light-sensitive layer composed of two layers 43 and 44 provided on a support 45. Both layers contain the same kind or different kinds of binder, but the silver halide can be incorporated in a layer different from a layer containing the leuco substance of photopolymerization sensitizing dye and the monomer. The light-sensitive material shown in FIG. 4 is composed of a combination of a sheet 46 comprising a light-sensitive layer 47 containing silver halide and a binder provided on a support 48 and a sheet 49 comprising a light-sensitive layer 50 containing a leuco substance of a photopolymerization sensitizing dye, a monomer and a binder provided on a support 51. In the case of light-sensitive materials shown in FIG. 3 and FIG. 4, a part or the whole of the leuco substance of the photopolymerization sensitizing dye can be incorporated into the layer containing silver halide.

The image recording process is illustrated by FIG. 2. In (A), when the light-sensitive material is imagewise exposed to light, a latent image 24 is formed on the silver halide in the exposed part. In (B), when the light-sensitive material is uniformly heated, an image 25 of silver and photopolymerization sensitizing dye is formed in the exposed part by the above described reaction 2. In (C), when the heated light-sensitive material is uniformly exposed to light, a polymer image 28 is formed by light excitation of the sensitizing dye according to the reaction (4). In this case, although unreacting silver halide is generally exposed to light, there is no problem. This polymer image can be developed by various known processes as described above, but the case where the polymer image is converted into a dye image by a monomer-dye bleach process is shown in (D). 34 is a heat-sensitive material having a heat-sensitive layer 38 containing a heat-sensitive substance provided on a support 36. When the heat-sensitive material is uniformly heated in close contact with the light-sensitive material having an image of polymer and residual monomer, the monomer remaining in the unexposed part by image exposure is diffused and transferred into the part 30 of the heat-sensitive layer to bleach a dye developed by heating of the heat-sensitive material. As a result, a heat-sensitive dye image 37 is formed in the polymer image part (image exposure area), because bleaching does not occur in the image exposure area. Namely, the recording mode is a negative-positive type. In the case of using the light-sensitive material shown in FIG. 3, the image can be recorded by the same manner. In the case of using the light-sensitive material shown in FIG. 4, after the light-sensitive layer 47 is imagewise exposed to light, the light-sensitive layers 47 and 50 are heated in close contact, or the light-sensitive layers 47 and 50 are brought into close contact, imagewise exposed to light through the support 48 or 51 and then heated.

In the case of developing the polymer image, image recording can be carried out by the same process as that shown in FIG. 2, except that two sheets are processed after separation.

In the above illustration, the case of using a negative type silver halide is described. However, in the case of using a positive type silver halide, the final polymer and dye images become positive-positive type concerning the original. Further, in the case of the light-sensitive materials shown in FIG. 2 and FIG. 3, heat development is sometimes obstructed by oxygen in the air. Therefore, in such a case, it is preferred that heating is carried out by closely putting a sheet of material which shields the air (for example, plastics, rubber, metal, etc.) on the light-sensitive layer or heating is carried out by a heat roller.

The leuco substance of the photopolymerization sensitizing dye is synthesized by reducing the photopolymerization sensitizing dye with a reducing agent, which may be added to a coating solution for the light-sensitive layer after separation. The leuco substance may be formed by reacting in the coating solution for the light-sensitive layer and/or in the light-sensitive layer after coating. The reaction of forming the leuco substance can be easily carried out at room temperature or by heating (for example, at the range of room temperature to 120° C. for 0 to 30 minutes). As the amount of reacting materials in the case of synthesizing the leuco substance, the reducing agent is used in an amount of 1 mol to 50 mols, preferably 1 mol to 20 mols, per mol of the photopolymerization sensitizing dye.

As silver halide light-sensititive materials of the present invention, those prepared by coating a known black-and-white silver halide/binder emulsion on a base can be used. As silver halide, there are silver chloride, silver chlorobromide, silver chloroiodide, silver bromide, silver iodobromide, silver chloroiodobromide and silver iodide. The particle size of the silver halide is in the range of 0.001 $\mu$m to 2 $\mu$m. The silver halide may be chemically sensitized with chemical sensitizers such as sulfur, selenium tellurium, gold, platinum, palladium, rhodium or iridium or reducing agents such as tin chloride, etc. It may be subjected to dye sensitization by a known manner. Details have been described in Mees, James, *The Theory of the Photographic Process* (The Macmillan Co. 1966), etc. The amount of silver halide is in the range of 0.01 g to 10 g/m$^2$, preferably 0.02 g to 1 g/m$^2$, as silver.

The reducing agent used in the present invention is added to the silver halide emulsion or is used as an aqueous solution. As the reducing agents, compounds capable of being oxidized themselves which reduce exposed silver halide into silver can be used. Specific examples include hydroquinone, alkyl substituted hydroquinones such as tert-butylhydroquinone or 2,5-dimethylhydroquinone, etc., catechol, pyrogallols, halogenated hydroquinones, alkoxy substituted hydroquinones such as methoxyhydroquinone, methyl gallate, ascorbic acid and derivatives or salts thereof, hydroxylamines such as N,N'-di(2-ethoxyethyl)hydroxylamine, etc., and pyrazolidones such as 1-phenyl-3-pyrazolidone or 4-methyl-4-hydroxymethyl-1-phenyl-3-pyrazolidone, etc. Among them, compounds which easily reduce photopolymerization sensitizing dyes described later into leuco substances thereof at room temperature or under heating can be used.

The amount of the reducing agent is small, for example, 1 mol or less, preferably 0.5 mol or less, per mol of the whole silver content, so that it can be sufficiently oxidized by the exposed silver halide or an organic silver salt oxidizing agent in the presence of exposed silver halide when using the exposed silver halide and the organic silver salt oxidizing agent. On the other hand, the reducing agent should be used in an amount sufficient to substantially completely reduce the photopolymerization sensitizing dye in an amount described later in the unexposed part to bleach it, and the amount of the reducing agent per unit area is in the range of 0.5 mol to 50 mols, preferably 1 mol to 20 mols, per mol of the photopolymerization sensitizing dye.

The above described organic silver salt oxidizing agent can be used by incorporating it in the silver halide emulsion. The organic silver salt oxidizing agent is a silver salt comparatively stable to light which is reduced into silver by reacting with the reducing agent when heated in the presence of exposed silver halide. Silver salts of aliphatic acids and aromatic carboxylic acids and silver salts of benzotriazole or derivatives thereof are used. The amount of the organic silver salt oxidizing agent is in the range of 0.5 to 20 mols, preferably 1 to 10 mols, per mol of silver.

It is preferred to add a thermal solvent to the light-sensitive layer containing silver halide in order to accelerate thermal development and to accelerate thermal transfer of the reducing agent into the photopolymerizable layer. The thermal solvent is a compound having a melting point in the temperature range of thermal development and transfer, for example, 80° C. to 200° C., which dissolves the reducing agent in a fused state and accelerates movement of it, but does not react with the silver halide, the reducing agent and components contained in the photopolymerizable layer. Examples of thermal solvents include polyhydroxy compounds, such as sorbitol, pentaerythritol, trimethylolpropane, trimethylolethane, hexanediol, cyclohexanediol, saponin, etc., urea, dimethyl urea, methyl urea, acetamide, N-methylacetamide, etc. The amount of the thermal solvent is in the range of 0.05 g to 5 g, preferably 0.1 g to 2 g, per gram of binder. As the binder, gelatin and water-soluble polymers such as polyvinyl alcohol, polyvinylpyrrolidone, carboxymethyl cellulose, etc., are preferred. The film thickness of the silver halide light-sensitive layer is in the range of 0.5 $\mu$m to 10 $\mu$m, preferably 1 $\mu$m to 5 $\mu$m.

Thermal development of the silver halide light-sensitive material and thermal transfer of the reducing agent into the photopolymerizable material can both be carried out (or in the case that the former is omitted and development of silver halide and transfer of the reducing agent are carried out at the same time by one step of heating) in the temperature range of 80° C. to 200° C., preferably 100° C. to 150° C., for the range of 3 seconds to 120 seconds, preferably 10 seconds to 60 seconds. Heating can be carried out by bringing the material in contact with a heating plate or by a method of passing the material through a heat roller, etc.

The photopolymerizable layer of the present invention is the layer which contains at least a polymerizable vinyl monomer and a photopolymerization sensitizing dye and is provided by coating the polymerizable vinyl monomer and the photopolymerization sensitizing dye on a base.

The photopolymerizable layer preferably contains a hydrogen donative compound and/or a binder.

The polymerizable vinyl monomer is a compound having at least one vinyl group or vinylidene group which is capable of causing radical polymerization and is non-gaseous at a temperature of 200° C. or less. Known acrylic acid and methacrylic acid and metal salts or esters thereof, acrylic amide, N,N-methylenebisacrylamide, vinyl ethers, N-vinyl compounds, vinyl acetate, etc., are used. Of these, esters of acrylic acid or methacrylic acid are particularly suitable. For example, there are monoacrylates such as methyl acrylate, ethyl acrylate, butyl acrylate, etc., diacrylates such as polyethylene glycol diacrylate, polypropylene glycol diacrylate, hexanediol diacrylate, glycerine diacrylate, trimethylolpropane diacrylate, pentaerythritol diacrylate, etc., tri- and tetraacrylate such as trimethylolpropane triacrylate, pentaerythritol triacrylate, pentaerythritol tetraacrylate, etc., and polymerizable prepolymers, for example, oligomers prepared by condensation of polybasic acid, polyhydric alcohol and acrylic acid as described in Japanese Patent Publication No. 7361/77, polyurethane acrylate described in Japanese Patent Publication No. 41708/73, epoxy acrylate, etc., and compounds wherein one or the whole of acryloyl groups in the above described acrylic acid esters are substituted by methacryloyl groups. Further, two or more monomers can be used at the same time. The amount of the photopolymerizable vinyl monomer is in the range of 0.3 to 30 g/m$^2$.

The photopolymerization sensitizing dye is a compound capable of forming a radical capable of initiating polymerization, which can be bleached by reduction in the dark with the above described reducing agent to form a colorless leuco substance. For example, there are Thionine, Methylene Blue, Rose Bengale, Erythrosine B, Eosine, Rhodamine, Phloxine-B, Safranine, acriflavine, Acridine Yellow, etc. As the hydrogen donative compounds, there are $\beta$-diketones such as dimedone, acetyl acetone, etc., amines such as triethanolamine, diethanolamine, dimethylamine, etc., sodium p-toluenesulfinate, N-phenylglycine, etc.

When the hydrogen donative compound is incorporated in the photopolymerizable layer used in the present invention, photopolymerization is effectively carried out, because the photopolymerization sensitizing dye excited by light irradiation is believed to react with the hydrogen donative compound to form a radical capable of initiating polymerization.

As the hydrogen donative compounds, there are $\beta$-diketones such as acetyl acetone, dimedone, etc., amines such as triethanolamine, diethanolamine, monoethanolamine, dimethylamine, diethylamine, tetramethylethylenediamine, triethylamine, phenylhydrazine, etc., sulfinic acids and salts thereof, such as p-toluenesulfinic acid, benzenesulfinic acid, p-(N-acetylamino)-benzenesulfinic acid, etc., N-phenylglycine, L-ascorbic acid, thiourea, allylthiourea, etc.

As the binders, water-soluble polymers can be used in the silver halide light-sensitive layer, such as gelatin, polyvinyl alcohol, etc., and thermoplastic polymers soluble in orgaic solvents, such as polymethyl methacrylate, polyvinyl chloride, vinylidene chloridevinyl chloride copolymer, vinylidene chloride-acrylonitrile copolymer, polyvinyl acetate, vinyl acetate-vinyl chloride copolymer, styrene-acrylonitrile copolymer, ABS resin, polyester, polyamide, chlorinated polyethylene, chlorinated polypropylene, polyvinyl butyral, polyvinyl formal, acetyl cellulose, etc., can be used.

As solvents for preparing a coating solution by dissolving them, water, toluene, methylene chloride, ethylene dichloride, chloroform, methyl ethyl ketone, acetone, ethyl acetate, ethanol, methanol, isopropanol, N,N-dimethylformamide, dimethylsulfoxide, etc., are used.

The photopolymerizable layer may further contain a thermal solvent. As the thermal solvent, those used for the silver halide light-sensitive layer are used.

The amount of the binder is in the range of 0.1 g to 10 g, preferably 0.3 g to 3 g, per gram of the monomer, and the amount of the photopolymerization sensitizing dye is in the range of 0.0001 mol to 0.1 mol, preferably 0.001 mol to 0.05 mol, per mol of the monomer. The amount of the hydrogen donative compound is in the range of 1 mol to 100 mols, preferably 3 mols to 50 mols, per mol of the photopolymerization sensitizing dye. The film thickness of the photopolymerizable layer is in the range of 1 $\mu$m to 50 $\mu$m, preferably 3 $\mu$m to 20 $\mu$m. The amount of the thermal solvent is in the range of 0.05 g to 5 g, preferably 0.1 to 2 g, per gram of the binder.

In the photopolymerizable layer, the monomer, the photopolymerization sensitizing dye and the hydrogen donative compound may be uniformly molecularly dispersed in the binder. In this case, these components are applied in a common solvent. However, it is more desirable that the monomer is ununiformly dispersed as particles in the continuous binder phase than is in a uniformly dispersed state, because it is hard to be subject to polymerization inhibiting action due to oxygen in the air. In this case, since the monomer is generally insoluble in water, it is applied as an emulsion by emulsifying in an aqueous solution of the water-soluble binder or as a dispersion of microcapsules. The photopolymerization sensitizing dye and the hydrogen donative compond are distributed in the monomer particles or the continuous binder phase according to thier solubilities. However, if all of them are present in the continous phase, there is also suitable because photopolymerization occurs.

Uniform exposure in the process of photoamplification is carried out by exposing to light so as to obtain a desired polymerization rate, using a light source having an absorption wavelength range of the photopolymerization sensitizing dye. The amount of exposure is, for example, in the range of $10^3$ to $10^8$ lux·sec, preferably $10^4$ to $10^7$ lux·sec.

Dyes and dye precursors suitably used in the present invention are known two component type color forming substances (dye precursors) used, generally, for heat-sensitive or pressure-sensitive materials and dyes obtained by heating them or by a solution reaction of them. The two component type color forming substance is composed of two components consisting of a color former and a color developer. These two components generally react with each other to form a dye even at room temperature, when they are brought in contact. When these two components are dispersed in the binder so as not to contact each other, the dye precursor for forming a visible image of the present invention is formed. In this case, at least one of two components fuses and diffuses by heating, and it reacts with the other component to form dye when brought in contact.

Examples of color formers of the two component type color forming substances include trephenylmethane lactones (or triphenylmethane phthalides, for example, Crystal Violet lactone or Malachite Green lactone, described in U.S. Pat. Nos. 2,548,366 and 1,505,472 and Japanese Patent Application (OPI) 56224/78; fluorans, for example, 3,6-dimethoxyfluoran, 2-methyl-6-isopropyl-aminofluoran, 2-bromo-3-chloro-6-n-propylamino-7-bromofluoran, 3-diethylamino-7-dibenzylaminofluoran, 3-dimethylamino-7-methylaminofluoran, 4,5,6,7-tetrachlorol',2',3'-trimethyl-6'-diethylaminofluoran, 3-diethylamino-5,6-benzofluoran, 3-diethylamino-7,8-benzofluoran, 2-N-ethyl-N-phenylamino-6-diethylaminofluoran, 2-N-phenyl amino-3-methyl-6-diethylaminofluoran, 2-N-phenylamino-3-methyl-6-N-ethyl-N-(p-tolyl)aminofluoran, 3-diethylamino-7-phenylfluoran, 3',6'-bis(N-methyl-N-phenylamino)-4,5,6,7-tetrachlorofluoran and 2- ethoxyethylamino-3-chloro-6-diethylaminofluoran, described in Japanese Patent Publications Nos. 18726/74, 18727/74, 4698/70, 4701/70, 29550/71, 4051/73, 4052/73, 4614/71, 8725/73, 8726/73, 10871/77, 23203/76 and 29662/72 and Japanese Patent Application (OPI) No. 82243/77; azaphthalides and diazaphthalides, for example, 3-(4'-diethylaminophenyl)-3-(4'-dimethylamino-2'-chlorophenyl)-7-azaphthalide and 3,3-bis(4'-dimethylaminophenyl)-4,7-diazaphthalide, described in Japanese Patent Publications No. 8727/73, 8728/73, 8729/73, 8730/73 and 18725/73; fluoran-γ-lactams (Rhodamine lactams) described in Japanese Patent Publications Nos. 29662/72 and 103710/74; phenothiazines, for example, benzoyl leuco Methylene Blue, described in Japanese Patent Application (OPI) Nos. 45319/73 and 34427/72; indolylphthalides described in Japanese Patent Application (OPI) No. 46010/72 and British Pat. No. 1,160,940; spiropyrans described in Japanese Patent Publication Nos. 14873/61 and 10783/72 and Japanese Patent Application (OPI) No. 95420/73; triphenylmethanes described in Japanese Patent Publication No. 16052/71 and Japanese Patent Applications (OPI) Nos. 92207/76 and 16137/79; chromenoindoles described in Japanese Patent Applications (OPI) No. 148099/77 and 126114/79; and compounds described in Japanese Patent Applications (OPI) Nos. 124930/75, 111528/79, 84238/77, 90255/78, 29552/71 and 121035/76 and Japanese Patent Publications Nos. 12317/71, 2530/71, 7473/80, 25654/70, 29552/71, 25654/70 and 5929/74.

A color former which forms a dye having a desired color and weather proofing property can be used in the present invention by selecting from the above described color formers. Further, two or more color formers can be used at the same time.

As the color developers of the two component type color forming substances, there are phenol compounds (for example, bisphenols such as bisphenol A, bisphenol B, 2,2-bis(4-hydroxyphenyl)-n-heptane, 1,1-bis(4-hydroxyphenyl) cyclohexane or 2-ethyl-1,1'-bis(4-hydroxyphenyl)hexane, etc., and phenols such as t-butylphenol, 4-phenylphenol, etc.), organic acids and anhydrides or salts thereof (for example, salicylic acid derivatives and zinc salts thereof, citric acid, tartaric acid, succinic acid, maleic acid, phthalic acid, phthalic acid anhydride, tetrachlorophthalic acid anhydride, p-toluenesulfonic acid and sodium salt thereof), inorganic salts (for example, aluminum sulfate, potassim alum and ammonium alum), acid clay, activated clay, kaolin and zeolite, etc. Of these, bisphenols are particularly suitable in the viewpoint of color density and coloring rate. The molar ratio of the color former to the color developer used for forming a visible image is in the range of 0.1 to 5, preferably 0.3 to 1.

In the case of providing the dye or dye precursor of the present invention on the base support, it is preferred to use a binder. As the binders to be used, there are water-soluble high polymers such as gelatin, polyvinyl and alcohol, polyvinylpyrrolidone, carboxymethyl cellulose, gum arabic, casein, etc., and high polymers soluble in orgnic solvents such as polymethyl methacrylate, polyvinyl chloride, vinylidene chloride-vinyl chloride copolymer, vinylidene chloride-acrylonitrile copolymer, polyvinyl acetate, vinyl acetatevinyl chloride copolymer, styrene-acrylonitrile copolymer, polyester, ABS resin, polyamide, chlorinated polyethylene, chlorinated polypropylene, polyvinyl butyral, polyvinyl formal, acetyl cellulose, etc. In the case of using the dye for forming a visible image of the present invention, coating may be accomplished by using any of the above described high polymers or any of water and organic solvent as the solvent. However, in the case of using the dye precursor, it is generally preferable to use a water-soluble high polymer as the binder and water as the solvent, because there is the possibility of immediately forming color by dissolution of the color former or the color developer in the organic solvent when the organic solvent is used. The binder and the solvent can be suitably selected in consideration of solubility of the monomer and the photopolymerization initiator according to the process of dispersing the monomer and the photopolymerization initiator, namely, whether they are dispersed in the binder in the state of particles or in the state of molecules. As solvents other than water, acetone, toluene, methylene chloride, dichloroethylene, chloroform, methyl ethyl ketone, ethyl acetate, dimethylformamide, dimethyl sulfoxide, etc., are used.

The ratio by weight of the dye or the color former of the dye precursor to the binder is in the range of 0.1 to 20, preferably 1 to 10. In the case of the dye, it may be dispersed in the binder in the state of molecules or in the state of particles. However, in the case of the dye precursor, the color former and the color developer are generally dispersed as particles in a solvent (binder solution) in which they are insoluble, in order to prevent color formation prior to formation of the image. The pH of the dispersion is preferably adjusted so as to be in the range of 2 to 12, preferably 3 to 10. The reason for it is that, if the pH is lower, bleaching of the dye caused by the monomer in the case of formation of the image hardly takes place, and, if the pH is higher, excessive bleaching takes place. The film thickness of each coating layer is in the range of 0.5 to 30 μm, preferably 1 to 10 μm.

As the base support, sheets or films such as paper, polyethylene terephthalate film, triacetyl cellulose film, water resisting paper provided with high polymer layers on both sides of the paper, etc., are preferred to be used for silver halide light-sensitive materials, photopolymerizable materials having a photopolymerizable layer and heat-sensitive materials having dyes or dye precursors.

Further, with respect to photpolymerizable materials, heat-sensitive materials and processes of using them, it is possible to use techniques described in U.S. patent application Ser. No. 677,453 filed on Dec. 3, 1984.

The present invention is illustrated with reference to nonlimiting examples.

EXAMPLE 1

Production of Silver Halide Light-Sensitive Material

A coating solution composed of 2g of a silver halide emulsion containing 10% by weight of silver chlorobromide (molar ratio of chlorine/bromine:1/1) and 7% by weight of gelatin, 0.03g of sodium ascorbate (reducing agent), 0.1 g of sorbitol (thermal solvent), 0.1 g of an aqueous solution containing 5% by weight of sodium p-dodecylbenzensulfonate and 10 g of water was prepared, and it was coated on a polythylene terephthalate film so as to result in a dry film thickness of about 1 μm, and dried to produce a silver halide light-sensitive material.

Production of Photopolymerizable Material

A mixture composed of

| | |
|---|---|
| Pentaerythritol tetraacrylate (polymerizable vinyl monomer) | 1 g |
| Thionine (photopolymerization sensitizing dye) | 0.005 g |
| Dimedone (hydrogen donative compound) | 0.1 g |
| Sorbitol (thermal solvent) | 0.3 g |
| Aqueous solution containing 10% by weight of polyvinyl alcohol (binder) | 6 g |
| Aqueous solution containing 5% by weight of sodium p-dodecylbenzene-sulfonate | 0.3 g | was emulsified by processing in an ultrasonic emulsifier for 1 hour, and it was coated on a polyethylene terephthalate film so as to result in a dry film thickness of about 10 μm, and dried to produce a photopolymerizable material.

Image Recording

After the above described silver halide light-sensitive material was exposed to light at 2,000 lux·sec through a stepwedge using a halogen lamp, it was brought in contact with the above described photopolymerizable material and heated for 30 seconds on a heating plate heated to 120° C. When two sheets were separated, a faint silver image was formed on the silver halide light-sensitive material. On the other hand, in the photopolymerizable material, a blue pattern of Thionine was formed on the part corresponding to the silver image. When the whole surface of the photopolymerizable material was then uniformly exposed to light at $10^6$ lux·sec using a halogen lamp, a frost image of colorless polymer was observed. When this frost image was immersed in a developing solution composed of 2 parts of ethanol and 1 part of water for 30 seconds, unhardened part was removed to obtain a polymer image.

EXAMPLE 2

Production of Heat-Sensitive Material

A color former solution was prepared by dispersing the following components together with glass beads by means of a homogenizer:

| | |
|---|---|
| 2-Ethoxyethylamino-3-chloro-6-diethylaminofluoran (color former) | 10 g |
| Aqueous solution containing 10% by weight of gelatin | 10 g |
| Aqueous solution containing 5% by weight of sodium p-dodecylbenzene-sulfonate | 0.2 g |
| Water | 40 g |

A color developer solution was prepared by dispersing the following components together with glass beads by means of a homogenizer:

| | |
|---|---|
| 2-Ethyl-1,1'-bis(4-hydroxyphenyl)-hexane (color developer) | 10 g |
| Aqueous solution containing 10% by weight of gelatin | 10 g |
| Aqueous solution containing 5% by weight of sodium p-dodecylbenzene-sulfonate | 0.2 g |
| Water | 40 g |

5g of the color former solution and 10g of the color developer solution was uniformly mixed and the mixture was coated on a polyethylene terephthalate film so as to result in a dry film thickness of about 3 μm and dried.

Image Recording

Using a silver halide material and a photopolymerizable material used in Example 1, a frost image of colorless polymer was formed on the photopolymerizable material by the same manner as in Example 1. When it was brought in contact with the above described heat-sensitive material and heated for 20 seconds on a heating plate heated to 120° C., a black image was formed on the heat-sensitive material. This image was that wherein the dye formed by development of the heat-sensitive material was bleached by a pattern of monomer remaining in the photopolymerizable material (negative relation to polymer image). The dye image was formed on the part of silver image, namely, the imagewise exposed part and had nearly the same sensitivity (step number of wedge) as silver image, and optical density was greatly higher than the silver image.

EXAMPLE 3

Production of Light-Sensitive Material

A silver halide light-sensitive material in Example 1 was produced. Further, a coating solution for photoplymerization material in Example 1 was coated on the silver halide layer so as to result in a dry film thickness of about 7 μm and dried by heating to about 80° C. to produce a light-sensitive material comprising two light-sensitive layers. Thionine was nearly completely reduced and bleached by sodium ascorbate contained in the lower layer to form a leuco substance.

Image Recording

After the above described light-sensitive material was imagewise exposed at 2,000 lux·sec through a stepwedge using a halogen lamp, it was heated in contact with a polyethylene terephthalate film for 20 seconds on a heating plate heated to 120° C., by which an image composed of blue Thionine and brown silver was formed in the exposed area. After the polyethylene terephthalate film was separated, it was uniformly exposed to light at $10^6$ lux·sec using a halogen lamp, by which Thionine was bleached and a frost image composed of colorless polymer was newly observed on the image exposure area together with the brown silver image. When it was immersed in a developing solution composed of 2 parts of ethanol and 1 part of water for 30 seconds, the unpolymerizing part was removed to obtain a polymer relief image. Sensitivity (step number of wedge) of the polymer image was nearly equal to that of the silver image.

EXAMPLE 4

A heat-sensitive material was produced by the same manner as in Example 2. Using the light-sensitive material in Example 3, a forst image composed of colorless polymer was formed by the same manner as in Example 3. When it was heated in close contact with the above described heat-sensitive material for 20 seconds on a heating plate heated to 120° C., a black image was developed. This image was that wherein the dye formed by development of the heat-sensitive material by heating was bleached by residual monomer (negative relation to the polymer image) in the light-sensitive material. The dye image was present in the part of image exposure, the sensitivity of which was nearly equal to that of the silver image and optical density was greatly high as that of the silver image.

While th invention has been described in detail and with reference to specific embodiments thereof, it will be apparent to one skilled in the art that various changes and modifications can be made therein without departing from the spirit and scope thereof.

What is claimed is:

1. An image recording process which comprises a step of (i) imagewise exposing a layer containing at least silver halide of an image recording material comprising (a) silver halide, (b) a reducing agent capable of developing silver halide, (c) a photopolymerization sensitizing dye capable of being reduced into a leuco substance by said reducing agent, (d) a polymerizable vinyl monomer and (e) a hydrogen donative compound, to light to form a latent image, a step of (ii) uniformly heating said recording material to form a photopolymerization sensitizing dye image in a part corresponding to said latent image, and thereafter a step of (iii) uniformly exposing a layer containing at least said formed photopolymerization sensitizing dye image and said polymerizable vinyl monomer to light to form a polymer image in the part where said photopolymerization sensitizing dye image is present, by photopolymerization.

2. An image recording process according to claim 1, which comprises a step of (iv-1) bleaching a dye capable of being bleached by vinyl monomers with the polymerizable vinyl monomer which was not polymerized, or a step of (iv-2) thermally developing a dye precursor under heating to form a dye capable of being bleached by vinyl monomers and bleaching the dye with the polymerizable vinyl monomer which was not polymerized, to form a dye image, after the step (iii) of the uniform exposure to light of the layer containing the photopolymerization sensitizing dye image and the polymerizable vinyl monomer.

3. An image recording process according to claim 1, wherein the image recording material comprises a base support having coated thereon a layer containing silver halide, a reducing agent, a photopolymerization sensitizing dye and a polymerizable vinyl monomer in the same layer.

4. An image recording process according to claim 1, wherein the image recording material comprises a base support having coated thereon a layer containing silver halide and a reducing agent and a layer containing a photopolymerization sensitizing dye and a polymerizable vinyl monomer.

5. An image recording process according to claim 1, wherein the image recording material is composed of a sheet (1) comprising a base support having coated thereon a layer containing silver halide and a reducing agent and a sheet (2) comprising a base support having coated thereon a layer containing a photopolymerization sensitizing dye and a polymerizable vinyl monomer, and the step (ii) of heating is carried out in the state that the layer of the sheet (1) and the layer of the sheet (2) are in contact after the step (i) of image exposure to form a latent image in the sheet (1).

6. An image recording process according to claim 1, wherein the reducing agent and the photopolymerization sensitizing dye in the image recording material are allowed to react by heating to form a leuco substance of the photopolymerization sensitizing dye, prior to image exposure of the step (i).

7. An image recording process according to claim 1, wherein said hydrogen donative compound is selected from the group consisting of β-diketones, amines, sulfinic acids and salts thereof, N-phenylglycine, L-ascorbic acid, thiourea and allylthiourea.

8. An image recording process according to claim 7, wherein said β-diketones are selected from the group consisting of acetyl acetone and dimedone; said amines are selected from the group consisting of triethanolamine, diethanolamine, monoethanolamine, dimethylamine, diethylamine, tetraethylenediamine, triethylamine and phenylhydrazine; and said sulfinic acids and salts thereof are selected from the group consisting of p-toluene sulfinic acid, benzene sulfinic acid and p-(n-acetylamino)-benzene sulfinic acid.

9. An image recording process according to claim 1, wherein said photopolymerization sensitizing dye is selected from the group consisting of Thionine, Methylene Blue, Rose Bengale, Erythrosine B, Eosine, Rhodamine, Phloxine-B, Safranine, acriflavine and Acridine Yellow.

* * * * *